United States Patent
Horng et al.

(10) Patent No.: US 10,163,686 B2
(45) Date of Patent: Dec. 25, 2018

(54) THERMAL SENSOR ARRANGEMENT AND METHOD OF MAKING THE SAME

(71) Applicant: TAIWAN SEMICONDUCTOR MANUFACTURING COMPANY, LTD., Hsinchu (TW)

(72) Inventors: Jaw-Juinn Horng, Hsinchu (TW); Szu-Lin Liu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 721 days.

(21) Appl. No.: 14/713,183

(22) Filed: May 15, 2015

(65) Prior Publication Data
US 2016/0290873 A1 Oct. 6, 2016

Related U.S. Application Data

(60) Provisional application No. 62/139,886, filed on Mar. 30, 2015.

(51) Int. Cl.
*G01K 7/01* (2006.01)
*H01L 21/765* (2006.01)
(Continued)

(52) U.S. Cl.
CPC .............. *H01L 21/765* (2013.01); *G01K 1/16* (2013.01); *G01K 7/01* (2013.01); *G01R 31/2874* (2013.01)

(58) Field of Classification Search
CPC ............ G01K 7/02; G01K 3/005; G01K 3/10; G01K 7/42; G01K 7/22; G01K 13/02; G01K 2205/04; G01K 2013/024; G01K 7/16; G01K 7/01; G01K 7/10; G01K 11/32; G01K 13/00; B23K 31/02; G01F 1/00; G01N 25/72; G01N 25/28; G01N 33/225; G01N 33/02; H05K 7/20945; F24F 11/0012; F24F 2001/0052; F24F 2011/0093; F24F 11/022; H02M 1/32; H02M 1/38; H02M 1/53806; H01C 7/008; H01C 1/14; H01C 17/00; H01R 4/023; H01R 4/029; H01R 43/28; G01R 31/2642; G01R 31/48; G01R 31/40; G01J 5/004; G01J 5/00; G01J 5/003; G01J 5/043; G01J 5/0821; A47J 43/287; F16B 2/02;
(Continued)

(56) References Cited

U.S. PATENT DOCUMENTS

2003/0141920 A1* 7/2003 Schrodinger ............ G01K 7/01
374/183
2005/0104176 A1* 5/2005 Rodney ............... E21B 47/0002
257/678

* cited by examiner

*Primary Examiner* — Manish S Shah
(74) *Attorney, Agent, or Firm* — Hauptman Ham, LLP

(57) ABSTRACT

A temperature sensor arrangement in an integrated circuit (IC) includes a sensor array configured to determine a temperature of the IC. The sensor array includes a first transistor having a first terminal, a second terminal and a gate. The temperature sensor array further includes a guard ring region between the sensor array and another circuit of the IC. The guard ring region includes a transistor structure having a first terminal, a second terminal and a gate. The temperature sensor arrangement further includes a thermally conductive element connected to the transistor structure and a first terminal of the first transistor. The thermally conductive element is configured to provide a thermally conductive path from the transistor structure to the first terminal of the first transistor.

20 Claims, 10 Drawing Sheets

(51) Int. Cl.
*G01R 31/28* (2006.01)
*G01K 1/16* (2006.01)

(58) Field of Classification Search
CPC .... F16B 1/00; F16B 47/00; F16B 2001/0035;
F16M 13/02; F16M 13/022
See application file for complete search history.

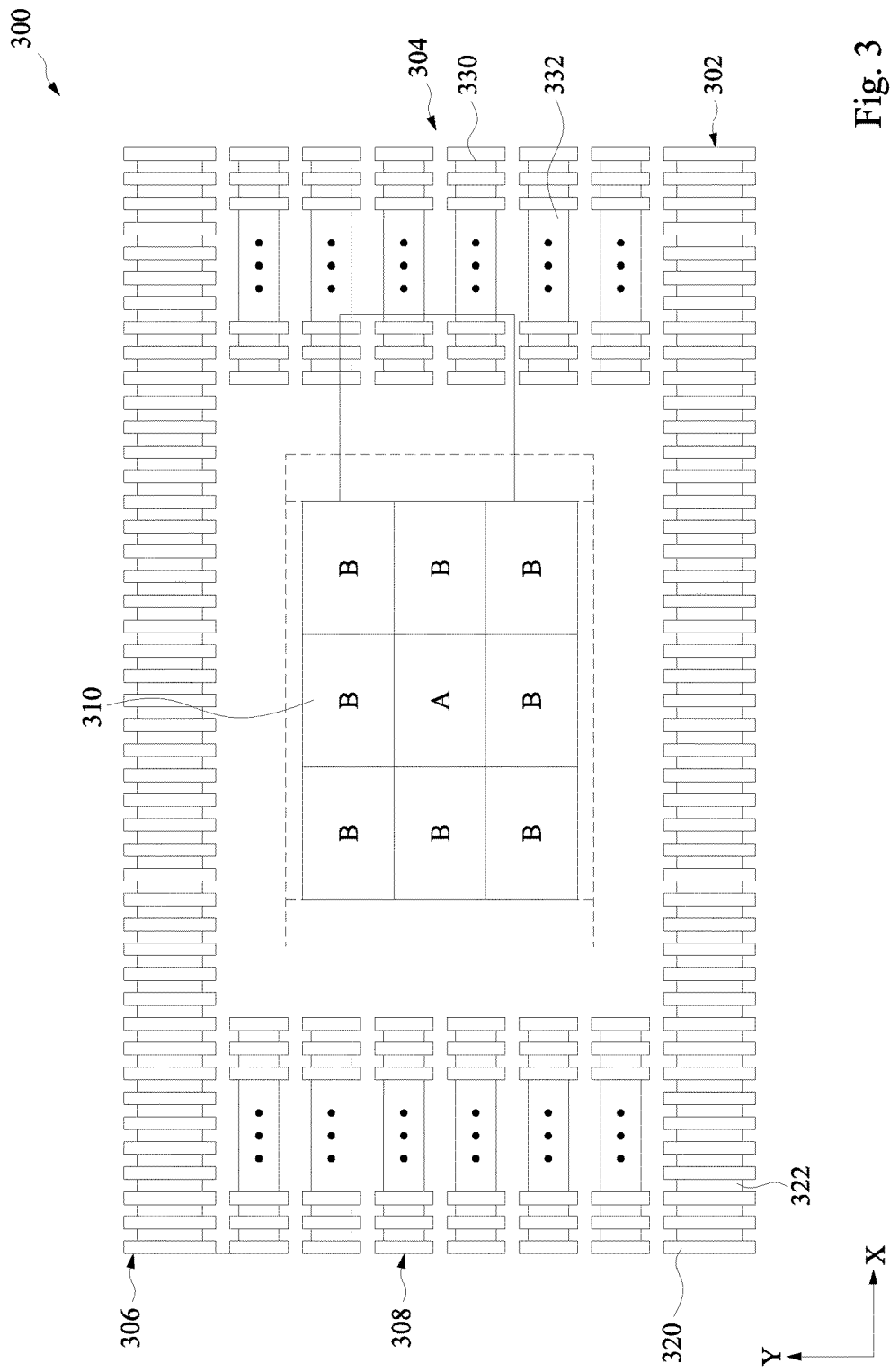

THERMAL SENSOR ARRANGEMENT AND METHOD OF MAKING THE SAME

BACKGROUND

Integrated circuits (ICs) generate heat during operation. The generated heat causes a temperature of the ICs to increase. As the temperature of the ICs increases, performance of the ICs is impacted in numerous ways including changes in resistance and capacitance of different materials within the ICs.

Temperatures of ICs are managed using heat sinks and other cooling devices. In some instances, these heat sinks or cooling devices are controlled based on a temperature of the ICs to reduce an amount of power consumed by the heat sinks or cooling devices. A thermal sensor is used to measure a temperature of the ICs during operation to help control the temperature of the ICs. In some instances, the thermal sensor includes bi-polar junction transistors (BJTs) or resistive temperature sensors.

As a node size of devices in the ICs decreases, heat transfer from the devices to a substrate of the ICs becomes more irregular which increases non-uniformity of temperature distribution in the ICs. In addition, non-planar device structures, such as fin field effect transistors (FinFETs) have a smaller area for heat transfer to an underlying substrate in comparison with planar devices, such as metal-oxide-semiconductor field effect transistors (MOSFETs).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 is a top view of a temperature sensor arrangement in accordance with one or more embodiments.

DETAILED DESCRIPTION

Figure 1:
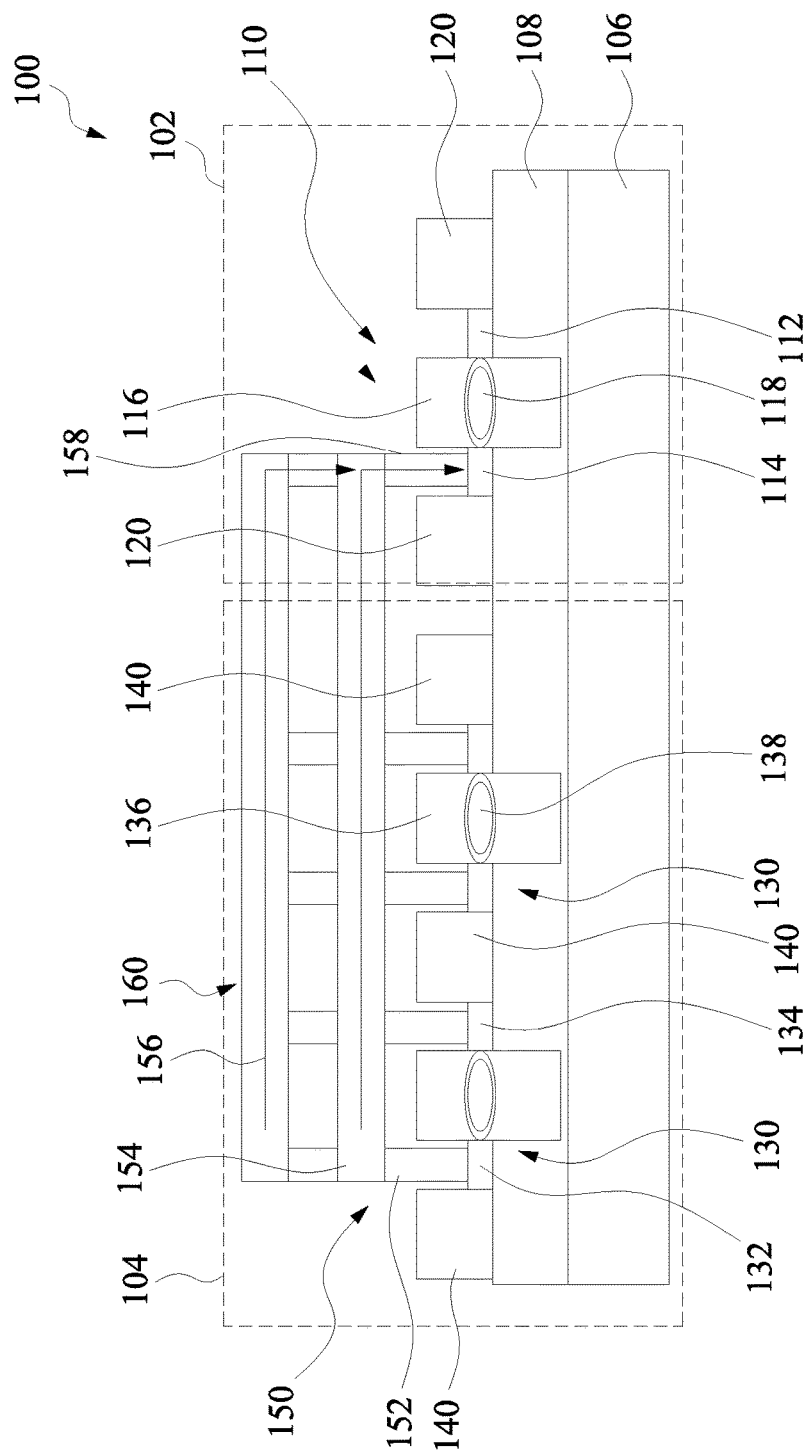
FIG. 1 is a cross-sectional view of a temperature sensor arrangement in accordance with one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view of a temperature sensor arrangement 100 in accordance with one or more embodiments. Temperature sensor arrangement 100 includes a sensor array 102 connected to a guard ring region 104. Sensor array 102 includes a plurality of transistors; however, only transistor 110 is included in FIG. 1 for the sake of clarity. A substrate 106 extends through sensor array 102 and guard ring region 104. An isolation region 108 is over substrate 106. Isolation region 108 is between a transistor 110 in sensor array 102 and transistors 130 in guard ring region 104. Isolation region 108 is also between transistor 110 in sensor array 102 and adjacent transistors (not shown) in the sensor array. Isolation region 108 is between gates of adjacent transistors 130 within guard ring region 104. Dummy gates 120 are between transistor 110 and adjacent transistors (not shown) in sensor array 102. Transistor 110 includes a first terminal 112, a second terminal 114 and a gate 116. Gate 116 is configured to control conductivity of a channel 118 between first terminal 112 and second terminal 114. Transistors 130 in guard ring region 104 include a first terminal 132, a second terminal 134 and a gate 136. Transistors 130 include a channel region 138 between first terminal 132 and second terminal 134.

A thermally conductive feature 150 is thermally connected to transistors 130 in guard ring region 104 and to second terminal 114 in sensor array 102. Thermally conductive feature 150 is configured to transfer thermal energy from guard ring region 104 to sensor array 102 to help increase accuracy of a temperature measurement of the sensor array. Thermally conductive feature 150 includes a via 152 connected to first terminal 132 and second terminal 134 of each transistor 130 in guard ring region 104. A line portion 154 is connected to via 152 and provides a thermally conductive path 156 from guard ring region 104 to sensor array 102. A via 158 is connected between line portion 154 and second terminal 114. A thermally conductive feature 160 is connected to thermally conductive feature 150. Thermally conductive feature 160 includes similar elements as thermally conductive feature 150; however, thermally conductive feature 160 is located farther from substrate 106 than thermally conductive feature 150. A combination of thermally conductive feature 150 and thermally conductive feature 160 provides a plurality of thermally conductive paths, e.g., thermally conductive path 156, between guard ring region 104 and sensor array 102.

Sensor array 102 is configured to determine a temperature of an integrated circuit (IC) sharing substrate 106. Temperature changes within the IC impact performance of devices within the IC. Accurately monitoring the temperature in the IC helps to ensure proper operation of devices within the IC. As technology nodes shrink and transistors shift from planar channel devices to three-dimension channel arrangements, the greater density of devices increases an amount of heat generated per area of the IC and interfaces for heat dissipation are reduced. Increased density of devices increases the importance of temperature management because simple radiative cooling is not sufficient for maintaining proper functioning of the IC, in some instances. The decreased interface for heat transfer from a device to the substrate of the IC reduces the accuracy of a temperature sensor which measures a temperature of the substrate.

Temperature sensor arrangement 100 includes thermally conductive feature 150 and thermally conductive feature 160 which are connected to first and second terminals 132 and 134 of transistors 130 within guard ring region 104. These thermally conductive features help to increase accuracy of a temperature measurement by sensor array 102. The accuracy of sensor array 102 is increased with respect to other approaches because thermally conductive feature 150 and thermally conductive feature 160 are connected to terminals 132 and 134 near channel 138 in guard ring region 104. The proximity between the connection location of thermally conductive feature 150 and thermally conductive feature 160 and channel 138 results in the thermal energy transferred to second terminal 114 in sensor array 102 being a more accurate measurement of the temperature of devices in the IC in comparison with an approach which relies on measurement of the temperature of the substrate, e.g., substrate 106, of the IC. The increased accuracy of the temperature measurement by sensor array 102 permits more precise control of temperature control within the IC. For example, in an IC that includes a fan for circulating air for cooling the IC, accuracy in the measurement by sensor array 102 helps to ensure that the fan is activated as soon as temperature conditions satisfy conditions for cooling the IC. The accuracy of sensor array 102 also helps to ensure that the fan is de-activated when temperature conditions do not call for cooling the IC, which reduces power consumption of the IC. In some embodiments, thermal sensor arrangement 100 is capable of operating at a voltage less than about 0.7 volts (V).

Sensor array 102 includes a plurality of transistors; however, only transistor 110 is included in FIG. 1 for the sake of clarity. Layout of transistors in sensor array 102 is discussed below. Sensor array 102 is configured to receive thermal energy from guard ring region 104 through thermally conductive feature 150 and thermally conductive feature 160. The thermal energy is based on a temperature of channels 138 in guard ring region 104. Sensor array 102 is configured to provide a temperature signal based on the thermal energy received from guard ring region 104.

Guard ring region 104 is configured to provide electromagnetic shielding for sensor array 102 and to provide thermal energy to the sensor array. Transistors 130 in guard ring region 104 are not used for performing functions of the IC. Transistors 130 help to provide shielding between different portions of the IC, so that the devices in the IC maintain proper performance despite parasitic effects from neighboring devices. In some embodiments, guard ring region 104 surrounds each transistor 110 in sensor array 102.

In some embodiments, guard ring region 104 surrounds sensor array 102 as a whole without separating transistors 110 within the sensor array from each other.

Substrate 106 supports devices of an IC which include sensor array 102 and guard ring region 104. In some embodiments, substrate 106 comprises an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In some embodiments, the alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, substrate 106 is a strained SiGe substrate. In some embodiments, the semiconductor substrate has a semiconductor on insulator structure, such as a silicon on insulator (SOI) structure. In some embodiments, the semiconductor substrate includes a doped epi layer or a buried layer. In some embodiments, the compound semiconductor substrate has a multilayer structure, or the substrate includes a multilayer compound semiconductor structure.

Isolation region 108 is configured to electrically isolate transistors 110 within sensor array 102 and transistors 130 in guard ring region 104. Isolation region 108 helps prevent undesired transfer of electrical signals between devices in the IC. In some embodiments, isolation region 108 includes silicon oxide, silicon nitride, silicon oxynitride, or another suitable insulating material. In some embodiments, isolation region 108 is formed by removing a portion of substrate 106 to form a cavity and filling the cavity with the insulating material. In some embodiments, isolation region 108 is formed by oxidizing or nitriding portions of substrate 106.

Transistor 110 is configured to help determine a temperature of the IC based on thermal energy received through thermally conductive feature 150 and thermally conductive feature 160. Transistor 110 is over substrate 106 without isolation region 108 therebetween. In some embodiments, transistor 110 is a metal-oxide-semiconductor field effect transistor (MOSFET), a fin field effect transistor (FinFET), a bi-polar junction transistor (BJT), a gate all around transistor, a high electron mobility transistor (HEMT) or another suitable transistor structure. The received thermal energy impacts a conductivity of channel 118 of transistor and a temperature measurement by sensor array 102 is determined based on the conductivity of channel 118.

Transistor 110 includes first terminal 112 and second terminal 114. Second terminal 114 is configured to receive thermal energy from guard ring region 104. First terminal 112 is electrically connected to other transistors in sensor array 102 and to external circuits for providing a temperature measurement signal to the external circuits. In some embodiments, first terminal 112 is connected to the external circuits through an interconnect structure. In some embodiments, first terminal 112 is a source of transistor 110 and second terminal 114 is a drain of transistor 110. In some embodiments, first terminal 112 is a drain of transistor 110 and second terminal 114 is a source of transistor 110. In some embodiments, first terminal 112 and second terminal 114 include doped regions. In some embodiments, first terminal 112 and second terminal 114 include strained materials. In some embodiments, first terminal 112 and second terminal 114 include a silicide region. In some embodiments, first terminal 112 and second terminal 114 are formed by implanting dopants into a fin or into substrate 106. In some embodiments, first terminal 112 and second terminal 114 are formed by removing a portion of substrate 106 to form an opening and filling the opening with a strained material.

Transistor 110 also includes gate 116 which is configured to control channel 118. A voltage applied to gate 116 determines the conductivity of channel 118. In addition, the thermal energy received at second terminal 114 also impacts the conductivity of channel 118. The temperature measurement by sensor array 102 is based on a relationship between the voltage applied to gate 116 and voltage output from transistor 110 at first terminal 112 for each transistor in the sensor array. In some embodiments, gate 116 includes a gate dielectric layer and a gate electrode layer. In some embodiments, gate 116 further includes a work function layer. In some embodiments, gate 116 includes polysilicon, a metallic material or another suitable conductive material. In some embodiments, gate 116 includes a silicide region. In some embodiments, gate 116 is formed by chemical vapor deposition (CVD), physical vapor deposition (PVD), atomic layer deposition (ALD), sputtering, or another suitable layer formation process.

Channel 118 is configured to selectively electrically connect first terminal 112 to second terminal 114. In some embodiments, channel 118 is a two-dimensional channel. In some embodiments, channel 118 is a three-dimensional channel.

Dummy gates 120 of sensor array 102 are over isolation region 108. Dummy gates 120 are not part of a functioning device. In some embodiments, dummy gates 120 are included to help with precise formation of transistor 110. In some embodiments, dummy gates 120 include a same material as gate 116. In some embodiments, dummy gates 120 include polysilicon or another suitable material. In some embodiments, dummy gates 120 are formed simultaneously with gate 116. In some embodiments, dummy gates 120 are formed sequentially with gate 116. In some embodiments, dummy gates 120 are connected to a power supply voltage (VDD) or a reference voltage (VSS). In some embodiments, dummy gates 120 are electrically floating.

Guard ring region 104 includes transistors 130. In some embodiments, transistors 130 have a same structure as transistor 110. In some embodiments, transistors 130 have a different structure from transistor 110. In some embodiments, transistors 130 are formed simultaneously with transistor 110. In some embodiments, transistors 130 are formed sequentially with transistor 130.

Transistors 130 include first terminal 132 and second terminal 134. First terminal 132 and second terminal 134 are connected to thermally conductive feature 150 and thermally conductive feature 160. First terminal 132 and second terminal 134 are configured to transfer thermal energy from channel 138 to thermally conductive feature 150 and thermally conductive feature 160. In some embodiments, first terminal 132 is a source of transistor 130 and second terminal 134 is a drain of transistor 130. In some embodiments, first terminal 132 is a drain of transistor 130 and second terminal 134 is a source of transistor 130. In some embodiments, first terminal 132 and second terminal 134 include doped regions. In some embodiments, first terminal 132 and second terminal 134 include strained materials. In some embodiments, first terminal 132 and second terminal 134 include a silicide region. In some embodiments, first terminal 132 and second terminal 134 are formed by implanting dopants into a fin or into substrate 106. In some embodiments, first terminal 132 and second terminal 134 are formed by removing a portion of substrate 106 to form an opening and filling the opening with a strained material.

Transistors 130 also includes gate 136 which is configured to control channel 138 to determine a conductivity of the channel. In some embodiments, gate 136 is configured to receive a biasing voltage. In some embodiments, gate 136 is electrically floating. In some embodiments, gate 136 includes a gate dielectric layer and a gate electrode layer. In some embodiments, gate 136 further includes a work function layer. In some embodiments, gate 136 includes polysilicon, a metallic material or another suitable conductive material. In some embodiments, gate 136 includes a silicide region. In some embodiments, gate 136 is formed by CVD, PVD, ALD, sputtering, or another suitable layer formation process.

Channel 138 is configured to selectively electrically connect first terminal 132 to second terminal 134. In some embodiments, channel 138 is a two-dimensional channel. In some embodiments, channel 138 is a three-dimensional channel.

Dummy gates 140 of guard ring region 104 are over isolation region 108. Dummy gates 140 are not part of a functioning device. In some embodiments, dummy gates 140 are included to help with precise formation of transistors 130. In some embodiments, dummy gates 140 include a same material as gate 136. In some embodiments, dummy gates 140 include polysilicon or another suitable material. In some embodiments, dummy gates 140 are formed simultaneously with gate 136. In some embodiments, dummy gates 140 are formed sequentially with gate 136. In some embodiments, dummy gates 140 are connected to VDD or VSS. In some embodiments, dummy gates 140 are electrically floating.

Thermally conductive feature 150 is configured to transfer thermal energy from guard ring region 104 to sensor array 102. In some embodiments, thermally conductive feature 150 includes a metallic material, such as copper, aluminum, tungsten, other suitable metallic materials or combinations thereof. In some embodiments, thermally conductive feature 150 includes a thermally conductive polymer. In some embodiments, thermally conductive feature 150 is formed using a dual damascene process or another suitable process. In some embodiments, thermally conductive feature 150 is formed simultaneously with an interconnect structure (not shown), e.g., the interconnect structure electrically connected to first terminal 112. In some embodiments, thermally conductive feature 150 is formed sequentially with the interconnect structure.

Thermally conductive feature 150 includes vias 152 connected to each first terminal 132 and second terminal 134 of transistors 130. Vias 152 extend in a direction perpendicular to a top surface of substrate 106. Vias 152 are configured to receive thermal energy related to a temperature of channel 138 through first terminal 132 and second terminal 134. Vias 152 are configured to transfer the thermal energy from first terminal 132 and second terminal 134 to line portion 154. In some embodiments, multiple vias 152 are connected to a same terminal of transistors 130. For example, multiple vias 152 are connected to first terminal 132 or second terminal 134, in some embodiments. In some embodiments, thermally conductive feature 150 includes vias 152 connected to less than all of first terminal 132 and second terminal 134 of transistors 130. For example, in some embodiments, thermally conductive feature 150 includes vias 152 connected only to first terminal 132 of transistors 130. In some embodiments, conductive feature 150 includes vias 152 connected to less than all transistors 130 of guard ring region 104. Vias 152 connected to all first terminals 132 and second terminals 134 in guard ring region 104 helps to increase the accuracy of the temperature measurement of sensor array 102, but also increases production costs and complexity.

Thermally conductive feature 150 further includes line portion 154 extending between guard ring region 104 and sensor array 102 and defining thermal conductive path 156. Line portion 154 is connected to each via 152. Line portion 154 extends in a direction parallel to the top surface of substrate 106. In some embodiments, thermally conductive feature 150 includes a plurality of line portions 154 and each line portion of the plurality of line portions is connected to at least one via 152. In some embodiments, line portion 154 is formed simultaneously with vias 152. In some embodiments, line portion 154 is formed sequentially with vias 152. In some embodiments, line portion 154 includes a same material as vias 152. In some embodiments, line portion 154 includes a different material from vias 152.

Thermally conductive feature 150 includes via 158 connected to second terminal 114. Via 158 extends in a direction perpendicular to the top surface of substrate 106. Via 158 is configured to transfer thermal energy from line portion 154 to second terminal 114. In some embodiments, multiple vias 158 are connected to second terminal 114. In some embodiments, thermally conductive feature 150 includes vias 158 connected to a terminal of every transistor in sensor array 102.

Thermally conductive feature 160 is connected to thermally conductive feature 150 and is configured to provide an additional thermally conductive path between guard ring region 104 and sensor array 102. Providing multiple thermally conductive paths between guard ring region 104 and sensor array 102 helps to increase the accuracy of the temperature measurement of the sensor array by spreading out the resistance to thermal energy transfer. In some embodiments, thermally conductive feature 160 includes a same material as thermally conductive feature 150. In some embodiments, thermally conductive feature 160 includes a different material from thermally conductive feature 150.

Thermally conductive feature 160 is connected to thermally conductive feature 150 by a plurality of vias. In some embodiments, thermally conductive feature 160 is connected to thermally conductive feature 150 by a single via. In some embodiments, thermally conductive feature 160 is connected to thermally conductive feature 150 by a thermally conductive plate.

In some embodiments, thermally conductive feature 160 is omitted in order to reduce a size of the IC or to reduce production costs and complexity. Thermally conductive feature 160 is farther from substrate 106 than thermally conductive feature 150. In some embodiments, thermally conductive feature 160 is a same distance from substrate 106 as thermally conductive feature 150. In some embodiments, thermally conductive feature 160 is connected to different transistors 130 than thermally conductive feature 150. Thermally conductive feature 160 is connected to second terminal 114 through thermally conductive feature 150. In some embodiments, thermally conductive feature 160 is connected to second terminal 114 independent of thermally conductive feature 150. In some embodiments, thermally conductive feature 160 is connected to different transistors in sensor array 102 than thermally conductive feature 150. In some embodiments, thermally conductive feature 160 is formed simultaneously with thermally conductive feature 150. In some embodiments, thermally conductive feature 160 is formed sequentially with thermally conductive feature 150.

Figure 2A:
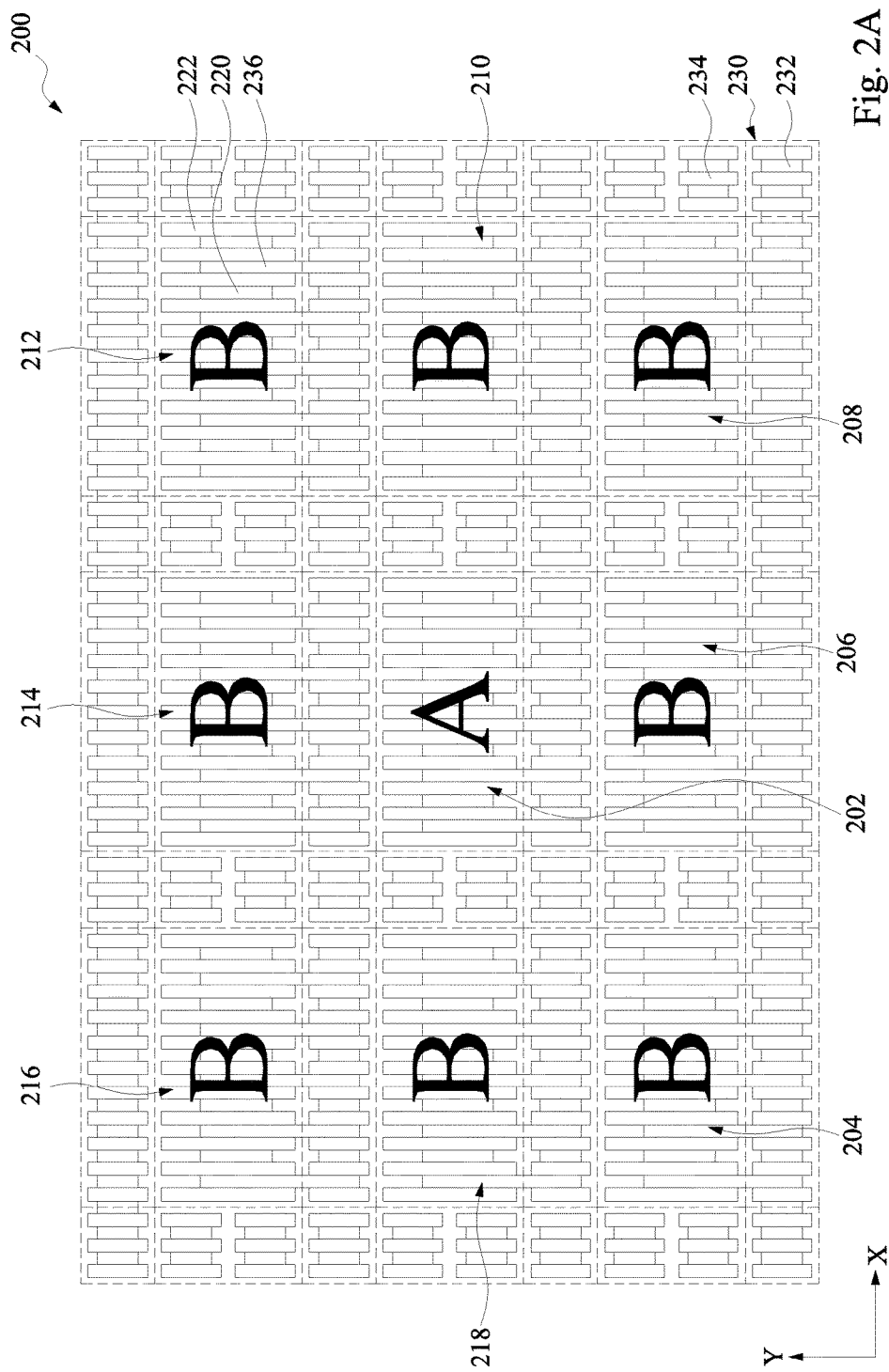
FIG. 2A is a top view of a temperature sensor arrangement in accordance with one or more embodiments.

FIG. 2A is a top view of a temperature sensor arrangement 200 in accordance with one or more embodiments. Temperature sensor arrangement 200 includes nine transistors. A transistor 202 is part of a first device (A) within temperature sensor arrangement 200. Transistors 204, 206, 208, 210, 212, 214, 216 and 218 are part of a second device (B) within temperature sensor arrangement 200. Transistors 202, 204, 206, 208, 210, 212, 214, 216 and 218 are over a doped region 220 of a substrate, e.g., substrate 106 (FIG. 1), of temperature sensor arrangement 200. Transistors 202, 204, 206, 208, 210, 212, 214, 216 and 218 include a gate 222. Temperature sensor arrangement 200 includes a guard ring region 230 around a perimeter of the temperature sensor arrangement. Guard ring region 230 is also between adjacent transistors 202, 204, 206, 208, 210, 212, 214, 216 and 218. Guard ring region 230 also includes a doped region 232 for the transistor structures, e.g., transistors 130, in the guard ring region. Guard ring region 230 also includes a thermally conductive feature 236 for providing a thermal conductive path between the guard ring region and transistors 202, 204, 206, 208, 210, 212, 214, 216 and 218.

Temperature sensor arrangement 200 is an example of a sensor array having a 1:8 ratio arrangement of transistors of the first device to transistors of the second device. In some embodiments, temperature sensor arrangement 200 includes a ratio of transistors of the first device to transistors of the second device different from 1:8.

Transistors 202, 204, 206, 208, 210, 212, 214, 216 and 218 have a structure similar to transistor 110 (FIG. 1). In comparison with transistor 110, FIG. 2A indicates that transistors 202, 204, 206, 208, 210, 212, 214, 216 and 218 have multiple fingers. Transistor fingers are used to separate the operation of a larger transistor device into smaller transistor structures in order to reduce voltage levels within an IC. Each finger of a transistor functions similar to a transistor gate. The fingers of the transistor are electrically connected and are collectively usable to control operation of the larger transistor device.

Guard ring region 230 includes segments extending around the perimeter of temperature sensor arrangement 200 and segments extending between adjacent transistors 202, 204, 206, 208, 210, 212, 214, 216 and 218 of the temperature sensor arrangement. In some embodiments, guard ring region 230 segments between adjacent transistors 202, 204, 206, 208, 210, 212, 214, 216 and 218 of temperature sensor arrangement 200 are omitted. In some embodiments, guard ring region 230 includes segments between less than all adjacent transistors 202, 204, 206, 208, 210, 212, 214, 216 and 218 of temperature sensor arrangement 200. For example, in some embodiments, guard ring region 230 includes segments separating transistor 202 from adjacent transistors 206, 210, 214 and 218; but no segments between adjacent transistors of the second device. In some embodiments, guard ring region 230 includes segments extending between adjacent transistors in a first direction, e.g., an X-direction, but not between adjacent transistors in a second direction, e.g., a Y-direction, perpendicular to the first direction.

Guard ring region 230 includes thermally conductive feature 236 for providing a thermal conductive path between the guard ring region and corresponding transistors of temperature sensor arrangement 200. In some embodiments, each thermally conductive feature 236 includes a single thermal conductive path. In some embodiments, at least one thermally conductive feature 236 includes multiple thermal conductive paths.

Thermally conductive feature 236 connects one transistor and one segment of guard ring region 230. Guard ring region 230 includes multiple thermally conductive features 236 connecting each transistor to a corresponding segment of guard ring region 230. In some embodiments, guard ring region 230 includes a single thermally conductive feature 236 connecting each transistor to a corresponding segment of guard ring region 230. In some embodiments, thermally conductive feature 236 connects at least one transistor 202, 204, 206, 208, 210, 212, 214, 216 or 218 to multiple segments of guard ring region 230. In some embodiments, more than one transistor 202, 204, 206, 208, 210, 212, 214, 216 or 218 is connected to a same segment of guard ring region 230.

Figure 2B:
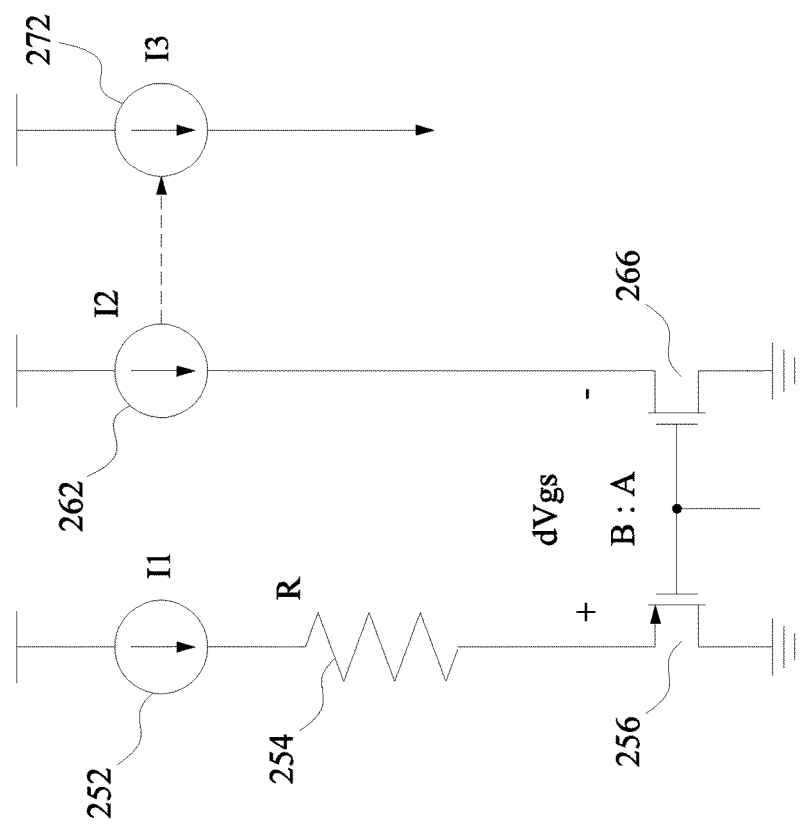
FIG. 2B is a schematic view of a temperature sensor arrangement in accordance with one or more embodiments.

FIG. 2B is a schematic view of a temperature sensor arrangement 250 in accordance with one or more embodiments. Temperature sensor arrangement 250 includes a first current generator 252. A resistor 254 having a resistance R is configured to receive a first current from first current generator 252. A first set of transistors 256 is connected to resistor 254 on an opposite side of the resistor from first current generator 252. A second current generator 262 is configured to generate a second current. A second set of transistors 266 is configured to receive the second current. A third current generator 272 is configured to mirror the second current and produce a proportional to absolute temperature (PTAT) current.

First set of transistors 256 includes a number, Q, of transistors electrically connected in a parallel arrangement. The number, Q, of transistors in first set of transistors 256 is greater than one. Second set of transistors 266 includes a number, P, of transistors electrically connected in a parallel arrangement. The number, P, of transistors in second set of transistors 266 is equal to or greater than one. In some embodiments, Q is greater than P. In some embodiments, Q is equal to P. First set of transistors 256 corresponds to the second device of temperature sensor arrangement 200 (FIG. 2A). In some embodiments, first set of transistors 256 includes transistors 204, 206, 208, 210, 212, 214, 216 and 218. Second set of transistors 266 corresponds to the first device of sensor arrangement 200. In some embodiments, second set of transistors 266 includes transistor 202.

In some embodiments, temperature sensor arrangement 250 is a configured to generate a proportional to absolute temperature (PTAT) current based on a temperature of the IC. In some embodiments, the PTAT current is defined by the following equation:

$$\text{PTAT} = (n_f KT/q) * \ln(m)$$

where $n_f$ is the ideality factor, K is Boltzmann's constant, T is absolute temperature, q is one electronic charge ($1.6 \times 10^{-19}$ C) and m is a ratio of Q:P.

Figure 2D:
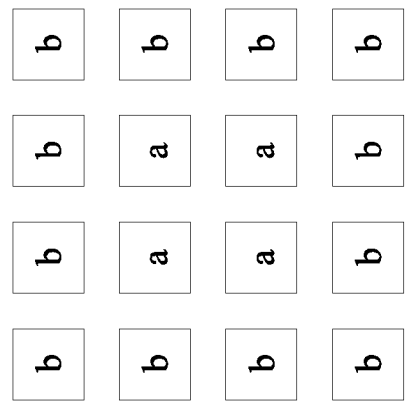
FIGS. 2C-2G are layouts of transistors of a temperature sensor arrangement in accordance with one or more embodiments.
Figure 2C:
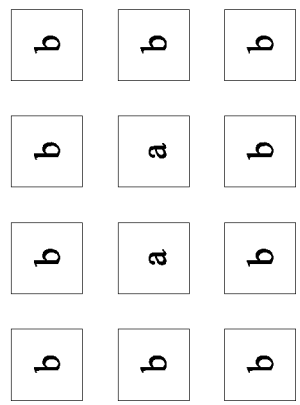

FIG. 2C is a layout of transistors of the first device, A, and transistors of the second device, B, of temperature sensor arrangement 200 in a 3×4 array in accordance with one or more embodiments. In some embodiments, in a centroid type pattern, the number, Q, of transistors of the second device, B, is determined by the equation Q=(n+2)×(m+2)−n×m, where n is a number of rows of transistors of the first device, A, and m is a number of columns of transistors of the first device, A. The transistors of the first device, A, are located in two central locations surrounded by one layer of transistors of the second device, B. For the layout of FIG. 2C, P equals two (2) and Q equals ten (10). In some embodiments, the centroid pattern includes a single transistor of the first device, A, surrounded by a plurality of transistors of the second device, B. The centroid type pattern including more than one transistor of the first device, A, tolerates an increase in supply current from second current generator 262, while maintaining a sufficiently low supply current to individual transistors.

FIG. 2D is a layout of transistors of the first device, A, and transistors of the second device, B, of temperature sensor arrangement 200 in a 4×4 array in accordance with one or more embodiments. The transistors of the first device, A, are located in four central locations surrounded by one layer of transistors of the second device, B. For the layout of FIG. 2D, P equals four (4) and Q equals twelve (12).

Figure 2F:
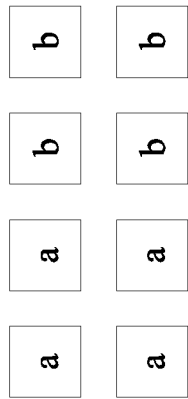
Figure 2G:
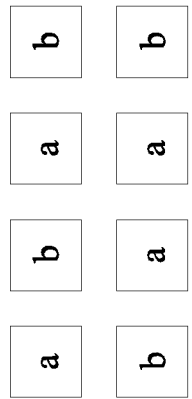
Figure 2E:
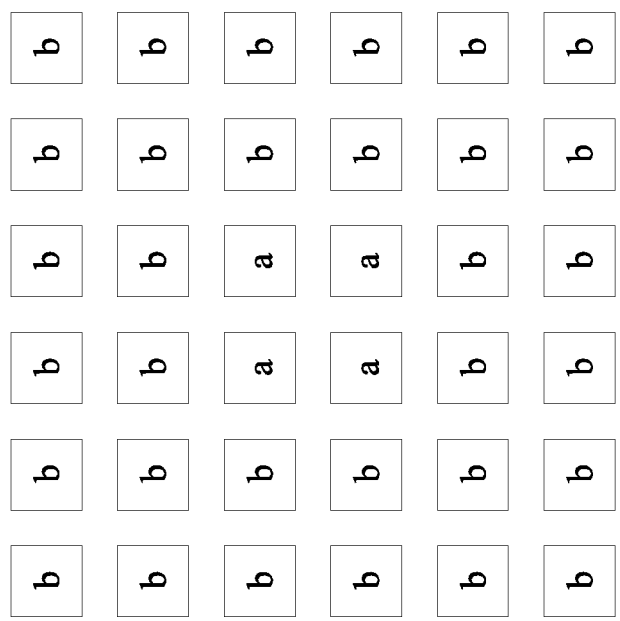

FIG. 2E is a layout of transistors of the first device, A, and transistors of the second device, B, of temperature sensor arrangement 200 in a 6×6 array in accordance with one or more embodiments. The transistors of the first device, A, are located in four central locations surrounded by two layers of transistors of the second device, B. Because the transistors of the first device, A, are surrounded by more than one layer of transistors of the second device, B. In some embodiments, in a centroid type pattern, the number, Q, of transistors of the second device, B, is determined by the equation Q=(n+E)×(m+E)−n×m, where n is a number of rows of transistors in the first device, A, m is a number of columns of transistors of the first device, A, and E is an even integer equal to or greater than two. The value of E is the number of transistors of the second device, B, separating any transistor of the first device, A, from an exterior of a centroid type pattern layout. Continuing with the above example and an E value selected as two, the ratio of transistors of the first device, A, to transistors of the second device, B, is 4 to 32.

FIGS. 2F and 2G are layouts of transistors of the first device, A, and transistors of the second device, B, of temperature sensor arrangement where the ratio of transistors Q:P is 1:1. Supply currents from first current generator 252 and second current generator 262 having a matching layout is higher than supply currents for temperature sensor arrangements having a centroid-type layout. However, in order to maintain the individual transistors operating in a current range having a linear ideality factor the number of transistors of the first device, A, and transistors of the second device, B, are increased as well.

FIG. 2F includes a matching pattern having a 2×2 array of transistors of the first device, A, beside a 2×2 array of transistors of the second device, B, to form a 2×4 array. FIG. 2G includes a matching pattern in a 2×4 array with transistors of the first device, A, and transistors of the second device, B, arranged in an alternating fashion. In some embodiments, transistors of the first device, A, and transistors of the second device, B, are arranged in different arrangements having a ratio of transistors of the first device, A, to transistors of the second device, B, of 1:1.

FIG. 3 is a top view of a temperature sensor arrangement 300 in accordance with one or more embodiments. Temperature sensor arrangement 300 includes a first guard ring region segment 302 extending in a first direction, e.g., the X-direction. A second guard ring region segment 304 extends in a second direction, e.g., the Y-direction, perpendicular to the first direction. A third guard ring region segment 306 extends in the first direction and second guard ring region segment 304 is between the third guard ring region segment and first guard ring region segment 302. A fourth guard ring region segment 308 extends in the second direction and the fourth guard ring region segment is between third guard ring region segment 306 and first guard ring region segment 302. A sensor array 310 is located inside a perimeter defined by guard ring region segments 302, 304, 306 and 308.

First guard ring region segment 302 includes a continuous doped area 322 extending in the first direction. A plurality of fingers 320 for transistor structures of first guard ring region segment 302 are spaced along doped area 322. In some embodiments, fingers 320 are part of transistors 130 (FIG. 1).

Second guard ring region segment 304 includes a plurality of discontinuous doped areas 332. The doped areas 332 individually extend in the first direction and are spaced from each other in the second direction. A plurality of fingers 330 are spaced along each doped area 332 of second guard ring region segment 304. A number of fingers 330 along each doped area 332 of second guard ring region segment 304 is at least three. In some embodiments, the number of fingers 330 along each doped area 332 of second guard ring region 304 is greater than three. In some embodiments, fingers 330 are part of transistors 130 (FIG. 1).

Third guard ring region segment 306 includes a similar structure as first guard ring region segment 302 and is located on an opposite side of sensor array 310 from the first guard ring region segment. Fourth guard ring region segment 308 has a similar structure as second guard ring region segment 304 and is located on an opposite side of sensor array 310 from the second guard ring region segment. In some embodiments, temperature sensor arrangement 300 includes guard ring region segments between at least one transistor of sensor array 310 and adjacent transistors of the sensor array. In some embodiments, temperature sensor arrangement 300 includes guard ring region segments between each transistor of sensor array 310 and adjacent transistors of the sensor array.

Figure 4:
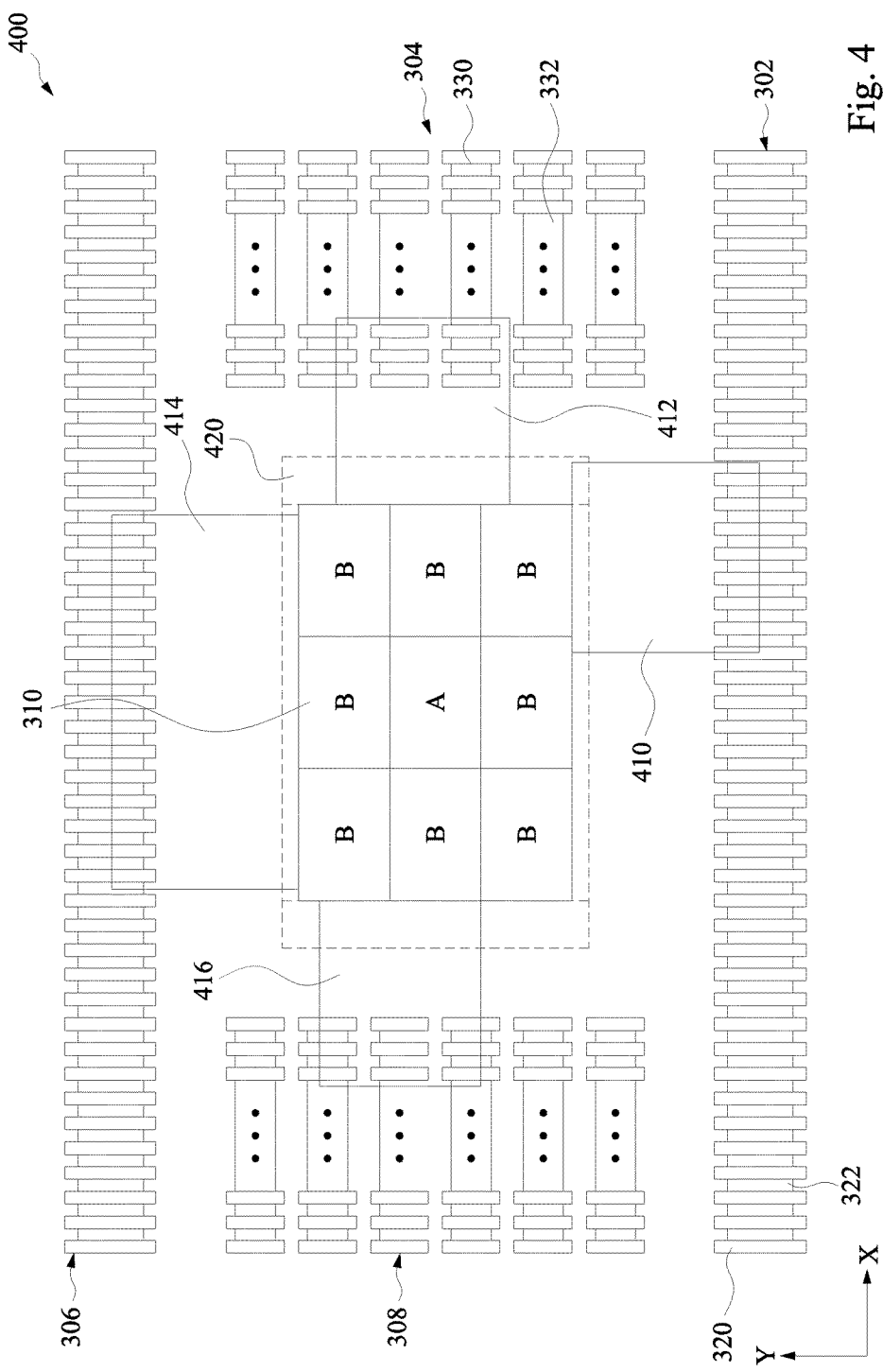
FIG. 4 is a top view of a temperature sensor arrangement in accordance with one or more embodiments.

FIG. 4 is a top view of a temperature sensor arrangement 400 in accordance with one or more embodiments. Temperature sensor arrangement 400 is similar to temperature sensor arrangement 300 and similar elements have a same reference number. In comparison with temperature sensor arrangement 300, temperature sensor arrangement 400 includes a first thermally conductive plate 410 connecting first guard ring region segment 302 to sensor array 310. Temperature sensor arrangement 400 includes a second thermally conductive plate 412 connecting second guard ring region segment 304 to sensor array 310. Temperature sensor arrangement 400 includes a third thermally conductive plate 414 connecting third guard ring region segment 306 to sensor array 310. Temperature sensor arrangement 400 includes a fourth thermally conductive plate 416 connecting fourth guard ring region segment 308 to sensor array 310. Temperature sensor array 400 also includes an intermediate conductive region 420 around a perimeter of sensor array 310 between the sensor array and guard ring region segments 302, 304, 306 and 308.

Thermally conductive plate 410 is configured to provide a thermally conductive path, e.g., thermally conductive path 156 (FIG. 1), between first guard ring region segment 302 and sensor array 310. In comparison with a thermally conductive line, thermally conductive plate 410 is capable of a wider thermally conductive path which helps to capture thermally energy from a larger portion of first guard ring region segment 302 along a single thermally conductive path. In some embodiments, thermally conductive plate 410 replaces line portion 154 (FIG. 1). In some embodiments, thermally conductive plate 410 includes a metallic material, such as copper, aluminum, tungsten, another suitable metallic material or combinations thereof. In some embodiments, thermally conductive plate 410 includes another suitable thermally conductive material, such as a thermally conductive polymer. In some embodiments, thermally conductive plate 410 is formed using a dual damascene process. In some embodiments, thermally conductive plate 410 is formed using CVD, PVD, sputtering, ALD or another suitable process.

Thermally conductive plates 412, 414 and 416 are configured to transfer thermal energy similar to thermally conductive plate 410. In some embodiments, at least one thermally conductive plate 410, 412, 414 or 416 includes a same material as at least one other thermally conductive plate 410, 412, 414 or 416. In some embodiments, at least one thermally conductive plate 410, 412, 414 or 416 includes a different material from at least one other thermally conductive plate 410, 412, 414 or 416. In some embodiments, at least one thermally conductive plate 410, 412, 414 or 416 is formed by a same process as at least one other thermally conductive plate 410, 412, 414 or 416. In some embodiments, at least one thermally conductive plate 410, 412, 414 or 416 is formed by a different process from at least one other thermally conductive plate 410, 412, 414 or 416. In some embodiments, at least one thermally conductive plate 410, 412, 414 or 416 is formed simultaneously with at least one other thermally conductive plate 410, 412, 414 or 416. In some embodiments, at least one thermally conductive plate 410, 412, 414 or 416 is formed sequentially with at least one other thermally conductive plate 410, 412, 414 or 416.

Intermediate conductive region 420 is configured to receive thermal energy from each of guard ring region segment 302, 304, 306 and 308 and pass the thermal energy to sensor array 310. Intermediate conductive region 420 helps to provide a uniform amount of thermal energy to each transistor of sensor array 310 to obtain a more accurate temperature measurement, in comparison with embodiments where guard ring region segments are directly connected to sensor array 310. Intermediate conductive region 420 helps to provide more uniform amount of thermal energy to transistors of sensor array 310 because heat sources adjacent to different guard ring segments 302, 304, 306 and 308 produce a different amount of heat, in some instances. Without intermediate conductive region 420, different transistors in sensor array 310 which are connected to different guard ring region segments will receive a different amount of thermal energy. In some embodiments, intermediate conductive region 420 is connected to sensor array 310 by line portions, e.g., line portion 154 (FIG. 1). In some embodiments, intermediate conductive region 420 includes polysilicon. In some embodiments, intermediate conductive region 420 includes a metallic material, such as copper, aluminum, tungsten, another suitable metallic material or combinations thereof. In some embodiments, intermediate conductive region 420 includes another suitable thermally conductive material, such as a thermally conductive polymer. In some embodiments, intermediate conductive region 420 is formed using CVD, PVD, sputtering, ALD, a growing process or another suitable process.

Figures 5A, 5B:
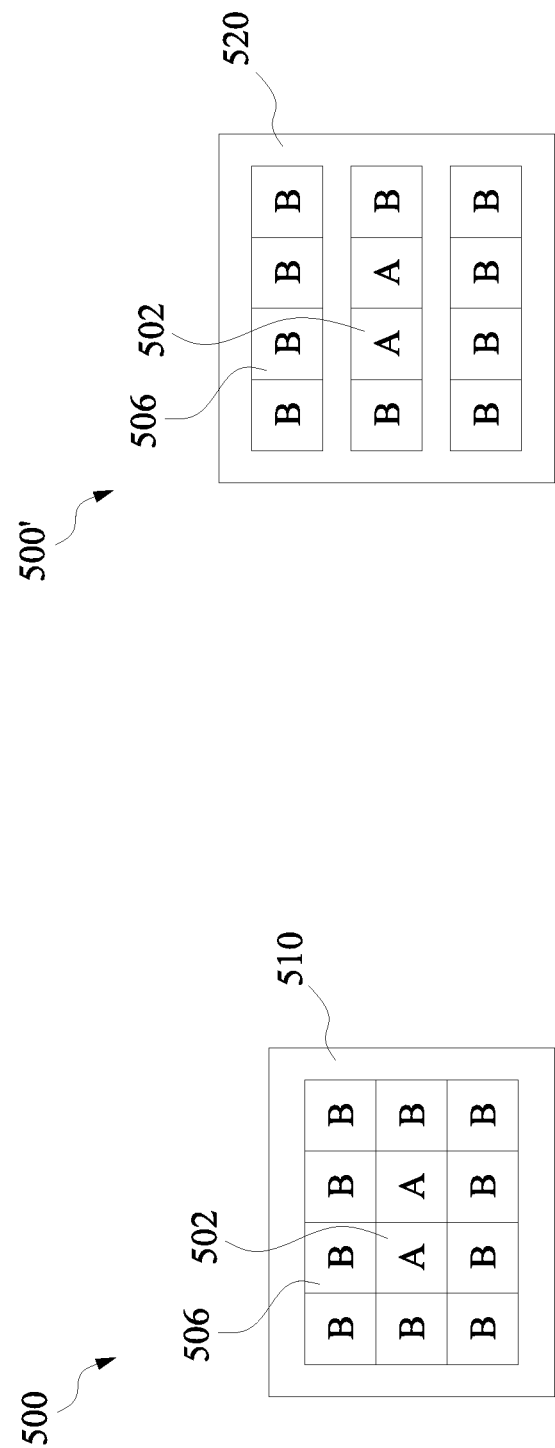
FIGS. 5A and 5B are layouts of transistors and a guard ring of a temperature sensor arrangement in accordance with one or more embodiments.

FIG. 5A is a layout of transistors and a guard ring of a temperature sensor arrangement 500 in accordance with one or more embodiments. Temperature sensor arrangement 500 includes two transistors 502 of the first device, A, surrounded by 10 transistors 506, of the second device, B, of a sensor array, e.g., sensor array 102 (FIG. 1). A guard ring region 510 surrounds a perimeter of transistors 506 of the second device, B. In some embodiments, guard ring region 510 is separated into a plurality of segments similar to temperature sensor arrangement 200, 300 or 400. In some embodiments, guard ring region 510 is spaced from transistors 506 of the second device, B, similar to temperature sensor arrangement 300 or 400.

FIG. 5B is a layout of transistors and a guard ring of a temperature sensor arrangement 500' in accordance with one or more embodiments. Temperature sensor arrangement 500' includes two transistors 502 of the first device, A, surrounded by 10 transistors 506, of the second device, B, of a sensor array, e.g., sensor array 102 (FIG. 1). A guard ring region 520 surrounds a perimeter of transistors 506 of the second device, B. Guard ring region 520 also includes segments between rows of transistors of the sensor array. In some embodiments, guard ring region 520 is separated into a plurality of segments similar to temperature sensor arrangement 200, 300 or 400. In some embodiments, guard ring region 520 around the perimeter of the sensor array is spaced from transistors 506 of the second device, B, similar to temperature sensor arrangement 300 or 400.

Figure 6:
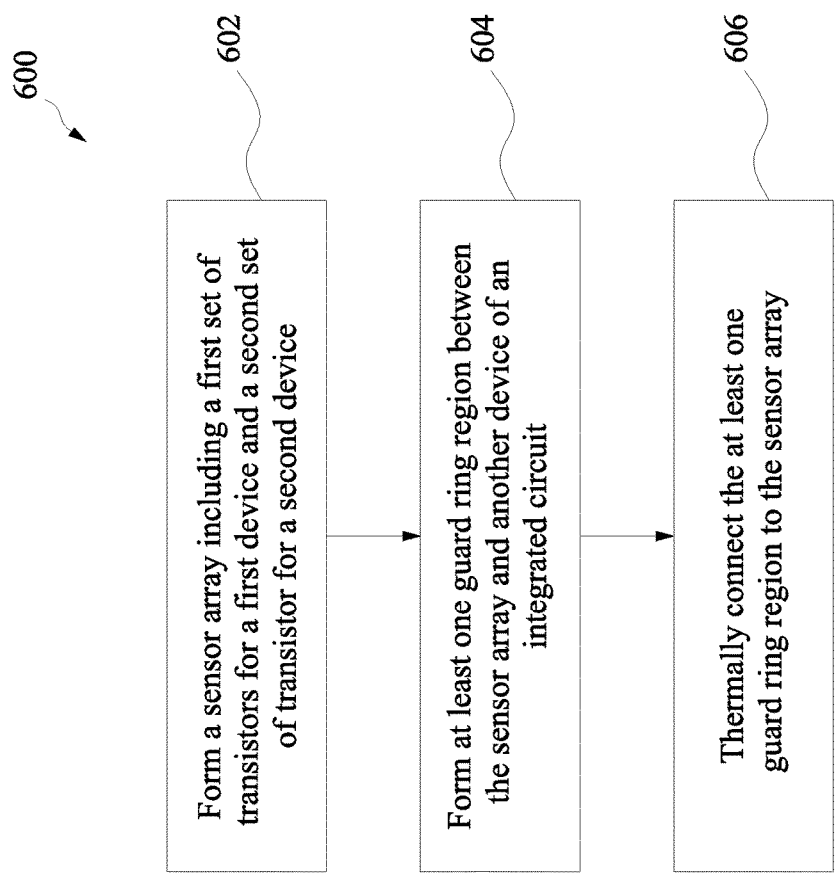
FIG. 6 is a flow chart of a method of making a temperature sensor arrangement in accordance with one or more embodiments.

FIG. 6 is a flow chart of a method 600 of making a temperature sensor arrangement in accordance with one or more embodiments. Method 600 begins with operation 602 in which a sensory array is formed. The sensor array includes a first set of transistors of a first device and a second set of transistors of a second device. The sensor array is configured to determine a temperature of an IC. In some embodiments, a number of transistors in the first device is equal to a number of transistors in the second device. In some embodiments, the number of transistors in the second device is less than the number of transistors in the second device. In some embodiments, the sensor array is configured to generate a PTAT current. In some embodiments, the transistors of the first device and the transistors of the second device include MOSFETs, FinFETS, gate all around transistors, BJTs, or another suitable type of transistors.

In some embodiments, the transistors of the first device and transistors of the second device are arranged in a centroid pattern. In some embodiments, the transistors of the first device and the second device are arranged in a matching pattern.

In operation 604 at least one guard ring region is formed between the sensor array and another device of the IC. The guard ring region helps to isolate the sensor array from parasitic effects based on operation of the other device of the IC. The guard ring region also collects thermal energy generated by the other device of the IC. The guard ring region includes transistor structures. In some embodiments, the transistor structures of the guard ring region include MOSFETs, FinFETS, gate all around transistors, BJTs, or another suitable type of transistors.

In some embodiments, the at least one guard ring region is spaced from the sensor array. In some embodiments, the at least one guard ring region surrounds a perimeter of the sensor array. In some embodiments, the at least one guard ring region extends between transistors of the sensor array in a first direction. In some embodiments, the at least one guard ring region extends between transistors of the sensor array in the first direction and in a second direction perpendicular to the first direction.

In operation 606 the at least one guard ring region is thermally connected to the sensor array. Thermally connecting the sensor array and the at least one guard ring region facilitates transfer the thermal energy collected in the at least one guard ring region to the sensor array. In some embodiments, the at least one guard ring region is thermally connected to the sensor array using a line portion. In some embodiments, the at least one guard ring region is thermally connected to the sensor array using a plurality of line portions. In some embodiments, the at least one guard ring region is thermally connected to the sensor array using a thermally conductive plate. In some embodiments, the at least one guard ring region is thermally connected to the sensor array through an intermediate conductive region between the sensor array and the at least one guard ring region.

Figure 7:
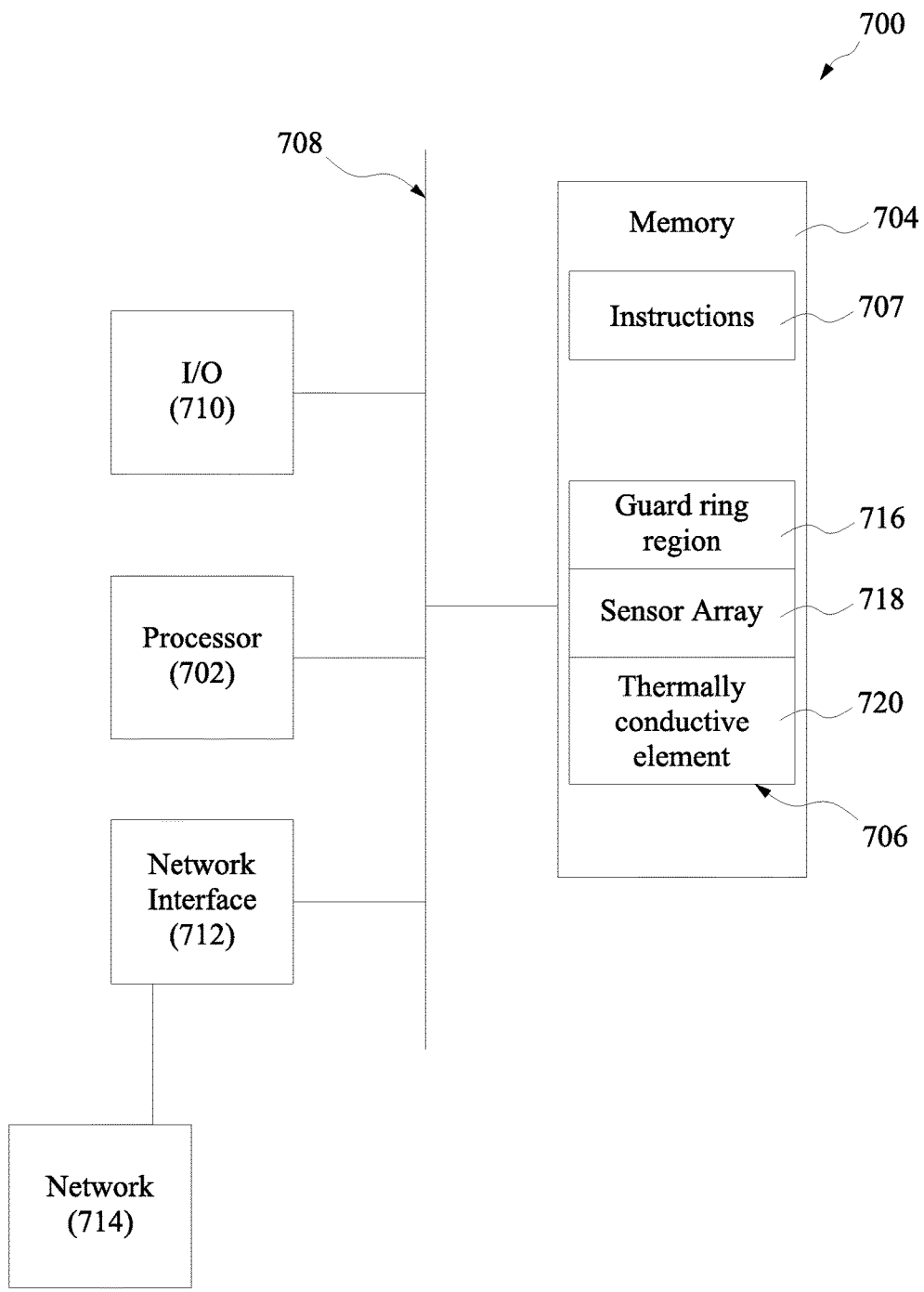
FIG. 7 is a system for designing a temperature sensor arrangement in accordance with one or more embodiments.

FIG. 7 is a system 700 for designing a temperature sensor arrangement in accordance with one or more embodiments. System 700 includes a hardware processor 702 and a non-transitory, computer readable storage medium 704 encoded with, i.e., storing, the computer program code 706, i.e., a set of executable instructions. Computer readable storage medium 704 is also encoded with instructions 707 for interfacing with manufacturing machines for producing the temperature sensor arrangement. The processor 702 is electrically coupled to the computer readable storage medium 704 via a bus 708. The processor 702 is also electrically coupled to an I/O interface 710 by bus 708. A network interface 712 is also electrically connected to the processor 702 via bus 708. Network interface 712 is connected to a network 714, so that processor 702 and computer readable storage medium 704 are capable of connecting to external elements via network 714. The processor 702 is configured to execute the computer program code 706 encoded in the computer readable storage medium 704 in order to cause system 700 to be usable for designing a temperature sensor arrangement, e.g., temperature sensor arrangement 100, 200, 300 or 400.

In some embodiments, the processor 702 is a central processing unit (CPU), a multi-processor, a distributed processing system, an application specific integrated circuit (ASIC), and/or a suitable processing unit.

In some embodiments, the computer readable storage medium 704 is an electronic, magnetic, optical, electromagnetic, infrared, and/or a semiconductor system (or apparatus or device). For example, the computer readable storage medium 704 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 704 includes a compact disk-read only memory (CD-ROM), a compact disk-read/write (CD-R/W), and/or a digital video disc (DVD).

In some embodiments, the storage medium 704 stores the computer program code 706 configured to cause system 700 to design the temperature sensor arrangement, e.g., temperature sensor arrangement 100, 200, 300 or 400. In some embodiments, the storage medium 704 also stores information needed for designing the temperature sensor arrangement as well as information generated during designing the temperature sensor arrangement, such as a guard ring region parameter 716, a sensory array parameter 718, a thermally conductive element parameter 720 and/or a set of executable instructions to design the thermal sensor arrangement.

In some embodiments, the storage medium 704 stores instructions 707 for interfacing with manufacturing machines. The instructions 707 enable processor 702 to generate manufacturing instructions readable by the manufacturing machines to effectively implement method 600 during a manufacturing process.

System 700 includes I/O interface 710. I/O interface 710 is coupled to external circuitry. In some embodiments, I/O interface 710 includes a keyboard, keypad, mouse, trackball, trackpad, and/or cursor direction keys for communicating information and commands to processor 702.

System 700 also includes network interface 712 coupled to the processor 702. Network interface 712 allows system 700 to communicate with network 714, to which one or more other computer systems are connected. Network interface 712 includes wireless network interfaces such as BLUETOOTH, WIFI, WIMAX, GPRS, or WCDMA; or wired network interface such as ETHERNET, USB, or IEEE-1394. In some embodiments, designing the temperature sensor arrangement is implemented in two or more systems 700, and information such as guard ring region layout, sensory array layout, thermally conductive element type are exchanged between different systems 700 via network 714.

System 700 is configured to receive information related to a type of guard ring region through I/O interface 710 or network interface 712. The information is transferred to processor 702 via bus 708 then stored in computer readable medium 704 as guard ring region parameter 716. System 700 is configured to receive information related to the sensor array through I/O interface 710 or network interface 712. The information is stored in computer readable medium 704 as sensory array parameter 718. System 700 is configured to receive information related to the thermally conductive element through I/O interface 710 or network interface 712. The information is stored in computer readable medium 704 as thermally conductive element parameter 720. During operation, processor 702 is executes instructions to generate the temperature sensor arrangement based on guard ring region parameter 716, sensor array parameter 718 and thermally conductive element parameter 720.

One aspect of this description relates to a temperature sensor arrangement in an integrated circuit (IC). The temperature sensor arrangement includes a sensor array configured to determine a temperature of the IC. The sensor array includes a first transistor having a first terminal, a second terminal and a gate. The temperature sensor array further includes a guard ring region between the sensor array and another circuit of the IC. The guard ring region includes a transistor structure having a first terminal, a second terminal and a gate. The temperature sensor arrangement further includes a thermally conductive element connected to the transistor structure and a first terminal of the first transistor. The thermally conductive element is configured to provide a thermally conductive path from the transistor structure to the first terminal of the first transistor.

Another aspect of this description relates to a method of making a temperature sensor arrangement. The method includes forming a sensor array, wherein the sensor array includes a first transistor of a first device, a plurality of second transistors of a second device different from the first device. The method further includes forming a guard ring region between the sensor array and another circuit of an integrated circuit, wherein the guard ring region includes a transistor structure. The method further includes forming a thermally conductive element between the sensor array and the guard ring region, wherein the thermally conductive element is connected to the transistor structure, the first transistor and each of the plurality of second transistors.

Still another aspect of this description relates to a system for designing a temperature sensor arrangement. The system includes a processor and a non-transitory computer readable medium connected to the processor. The non-transitory computer readable medium comprises. The processor is configured to execute the instructions for designing a sensor array, wherein the sensor array includes a first transistor of a first device, a plurality of second transistors of a second device different from the first device. The processor is further configured to execute the instructions for designing a guard ring region between the sensor array and another circuit of an integrated circuit, wherein the guard ring region includes a transistor structure. The processor is further configured to execute the instructions for designing a thermally conductive element between the sensor array and the guard ring region, wherein the thermally conductive element is connected to the transistor structure, the first transistor and each of the plurality of second transistors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A temperature sensor arrangement in an integrated circuit (IC), the temperature sensor arrangement comprising:
   a sensor array configured to determine a temperature of the IC, wherein the sensor array comprises a first transistor having a first terminal, a second terminal and a gate;
   a guard ring region between the sensor array and another circuit of the IC, wherein the guard ring region comprises a transistor structure having a first terminal, a second terminal and a gate; and
   a thermally conductive element connected to the transistor structure and the first terminal of the first transistor, wherein the thermally conductive element is configured to provide a thermally conductive path from the transistor structure to the first terminal of the first transistor.

2. The temperature sensor arrangement of claim 1, wherein the guard ring region surrounds a perimeter of the sensor array.

3. The temperature sensor arrangement of claim 1, wherein the guard ring region is spaced from the sensor array.

4. The temperature sensor arrangement of claim 1, wherein the sensor array comprises a plurality of second transistors, wherein each of the plurality of second transistors is part of a second device, the first transistor is part of a first device different from the second device.

5. The temperature sensor arrangement of claim 4, wherein the first transistor and the plurality of second transistors are arranged in a centroid arrangement.

6. The temperature sensor arrangement of claim 4, wherein the first transistor is one of a plurality of first transistors, and the plurality of first transistors and the plurality of second transistors are arranged in a matching arrangement.

7. The temperature sensor arrangement of claim 4, wherein the thermally conductive element is connected to each of the plurality of second transistors.

8. The temperature sensor arrangement of claim 1, wherein the guard ring region comprises at least one segment extending through the sensor array in a first direction.

9. The temperature sensor arrangement of claim 8, wherein the guard ring region further comprises at least one segment extending through the sensor array in a second direction perpendicular to the first direction.

10. The temperature sensor arrangement of claim 8, wherein the guard ring region also surrounds a perimeter of the sensor array.

11. The temperature sensor arrangement of claim 1, wherein the thermally conductive element comprises a plurality of line portions.

12. The temperature sensor arrangement of claim 1, wherein the thermally conductive element comprises a thermally conductive plate.

13. The temperature sensor arrangement of claim 1, wherein the thermally conductive element is connected to the first terminal and the second terminal of the transistor structure.

14. The temperature sensor arrangement of claim 1, further comprising an intermediate conductive region between the sensor array and the guard ring region.

15. The temperature sensor arrangement of claim 14, wherein the thermally conductive element comprises a first portion and a second portion, the first portion extends from the guard ring region to the intermediate conductive region, and the second portion extends from the intermediate conductive region to the first terminal of the first transistor.

16. A temperature sensor arrangement, the temperature sensor arrangement comprising:
    a sensor array comprising at least one first transistor of a first device, and a plurality of second transistors of a second device, wherein the second device is different from the first device;
    a guard ring region between the sensor array and another circuit of an integrated circuit, wherein the guard ring region comprises a transistor structure; and
    a thermally conductive element, wherein the thermally conductive element is thermally connected to the transistor structure, the at least one first transistor and each second transistor of the plurality of second transistors.

17. The temperature sensor arrangement of claim 16, wherein the guard ring region comprises first segments extending around a perimeter of the sensor array.

18. The temperature sensor arrangement of claim 17, wherein the guard ring region further comprises second segments between adjacent first and second transistors.

19. The temperature sensor arrangement of claim 16, wherein the at least one first transistor and the plurality of second transistors are arranged in a centroid arrangement or in a matching arrangement.

20. A temperature sensor arrangement, the temperature sensor arrangement comprising:
    a sensor array comprising at least one first transistor of a first device, and a plurality of second transistors of a second device, wherein the second device is different from the first device;
    a guard ring region comprising a plurality of guard ring region segments surrounding a perimeter of the sensor array; and
    a thermally conductive element thermally connecting the sensor array and the plurality of guard ring region segments, wherein the thermally conductive element comprises a plurality of thermally conductive plates and an intermediate conductive region around the perimeter of the sensor array, the intermediate conductive region thermally connects the plurality of thermally conductive plates to the sensor array.

* * * * *